United States Patent
Dokumaci et al.

(10) Patent No.: US 7,960,790 B2
(45) Date of Patent: Jun. 14, 2011

(54) SELF-ALIGNED PLANAR DOUBLE-GATE TRANSISTOR STRUCTURE

(75) Inventors: Omer H. Dokumaci, Wappingers Falls, NY (US); Bruce B. Doris, Brewster, NY (US); Kathryn W. Guarini, Yorktown Heights, NY (US); Suryanararyan G. Hegde, Hollowville, NY (US); Meikei Ieong, Wappingers Falls, NY (US); Erin Catherine Jones, Corvallis, OR (US)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 12/119,765

(22) Filed: May 13, 2008

(65) Prior Publication Data

US 2008/0246090 A1   Oct. 9, 2008

Related U.S. Application Data

(60) Continuation of application No. 11/676,030, filed on Feb. 16, 2007, now Pat. No. 7,453,123, which is a division of application No. 10/663,471, filed on Sep. 15, 2003, now Pat. No. 7,205,185.

(51) Int. Cl.
   *H01L 27/01* (2006.01)
(52) U.S. Cl. ........ 257/347; 257/365; 257/366; 257/368; 257/E27.112; 257/E29.264; 257/E29.275
(58) Field of Classification Search .................. 257/347, 257/365, 366, 368, E27.112, E29.264, E29.275
See application file for complete search history.

(56) References Cited

U.S. PATENT DOCUMENTS

| | | | |
|---|---|---|---|
| 4,346,446 | A | 8/1982 | Erbstein |
| 5,102,815 | A | 4/1992 | Sanches |
| 5,208,472 | A | 5/1993 | So |
| 5,468,665 | A | 11/1995 | Lee |
| 5,646,058 | A | 7/1997 | Taur et al. |
| 5,691,212 | A | 11/1997 | Tsai |
| 5,712,173 | A | 1/1998 | Liu et al. |
| 5,773,331 | A | 6/1998 | Solomon |
| 5,891,798 | A | 4/1999 | Doyle et al. |
| 5,899,722 | A | 5/1999 | Huang |

(Continued)

OTHER PUBLICATIONS

Wolf, "Silicon Processing for the VLSI Era, Vol. 4: Deep-Submicron Process Technology", Lattice Press, 2002, pp. 537-540, California.

*Primary Examiner* — Andy Huynh
(74) *Attorney, Agent, or Firm* — Scully, Scott, Murphy & Presser, P.C.; Louis J. Percello, Esq.

(57) ABSTRACT

A double-gate transistor having front (upper) and back gates that are aligned laterally is provided. The double-gate transistor includes a back gate thermal oxide layer below a device layer; a back gate electrode below a back gate thermal oxide layer; a front gate thermal oxide above the device layer; a front gate electrode layer above the front gate thermal oxide and vertically aligned with the back gate electrode; and a transistor body disposed above the back gate thermal oxide layer, symmetric with the first gate. The back gate electrode has a layer of oxide formed below the transistor body and on either side of a central portion of the back gate electrode, thereby positioning the back gate self-aligned with the front gate. The transistor also includes source and drain electrodes on opposite sides of said transistor body.

18 Claims, 4 Drawing Sheets

U.S. PATENT DOCUMENTS

| | | |
|---|---|---|
| 5,902,121 A | 5/1999 | Goto |
| 5,905,293 A | 5/1999 | Jeng |
| 6,074,920 A | 6/2000 | Houston |
| 6,117,711 A | 9/2000 | Wu |
| 6,339,002 B1 | 1/2002 | Chan |
| 6,352,872 B1 | 3/2002 | Kim et al. |
| 6,365,465 B1 | 4/2002 | Chan |
| 6,372,559 B1 | 4/2002 | Crowder |
| 6,396,108 B1 | 5/2002 | Krivokapic et al. |
| 6,403,981 B1 | 6/2002 | Yu |
| 6,465,823 B1 | 10/2002 | Yagishita et al. |
| 6,611,023 B1 | 8/2003 | En et al. |
| 6,646,307 B1 * | 11/2003 | Yu et al. ................. 257/347 |
| 6,833,569 B2 | 12/2004 | Dokumaci et al. |

* cited by examiner

SELF-ALIGNED PLANAR DOUBLE-GATE TRANSISTOR STRUCTURE

RELATED APPLICATIONS

This application is a continuation of U.S. Ser. No. 11/676,030, filed Feb. 16, 2007, now U.S. Pat. No. 7,453,123 issued on Nov. 18, 2008, which is a divisional of U.S. Ser. No. 10/663,471, filed Sep. 15, 2003, now U.S. Pat. No. 7,205,185, issued on Apr. 17, 2007.

TECHNICAL FIELD

The field of the invention is that of forming dual-gate transistors in integrated circuit processing, in particular self-aligned dual gate transistors.

BACKGROUND OF THE INVENTION

Workers in the field of integrated circuits are constantly striving to reduce the size of devices, in particular transistors.

As FET dimensions are scaled down, it becomes increasingly difficult to control short-channel effects by conventional means. Short-channel effects well known to those skilled in the art are the decrease in threshold voltage Vt, in short-channel devices, i.e. sub-0.1 micron, due to two-dimensional electrostatic charge sharing between the gate and the source/drain region.

An evolution beyond the standard single gate metal oxide semiconductor field effect transistor (MOSFET) is the double-gate MOSFET, in which the device channel is confined between top and bottom gate dielectric layers. This structure, with a symmetrical gate structure, can be scaled to about half of the channel length as compared with a conventional single gate MOSFET structure. It is well known that a dual gate or double-gate MOSFET device has several advantages over conventional single gate MOSFET devices. Specifically, the advantages over conventional single gate counterparts include: a higher transconductance, and improved short-channel effects.

For instance, Monte Carlo simulation has been carried out on a 30 nm channel dual-gate MOSFET device and has shown that the dual gate device has a very high transconductance (2300 mS/nm) and fast switching speeds (1.1 ps for nMOSFET).

Moreover, improved short channel characteristics are obtained down to 20 nm channel length with no doping needed in the channel region. This circumvents the tunneling breakdown, dopant quantization, and dopant depletion problems associated with channel doping that are normally present with single gate MOSFET devices.

Currently, both vertical and horizontal gate structures are actively being pursued by many workers in the field. The horizontal gate structure has several advantages over the vertical structures due to the similarity of current state of the art CMOS devices. However, one major and formidable challenge of fabricating the double gate is aligning the bottom gate to the top gate.

SUMMARY OF THE INVENTION

The invention relates to an integrated circuit having dual-gate transistors.

An aspect of the invention is the formation of a self-aligned back gate by oxidizing a portion of the back gate electrode layer using the front gate as an oxidation mask.

Another aspect of the invention is the implantation at the outer edges of the structure of a species that promotes oxidation.

Another aspect of the invention is the oxidation for a sufficient time and temperature to reduce stress in the transistor body.

Another aspect of the invention is the transverse extent of the oxidation to extend the boundary of the back gate below the edge of the transistor body.

Another aspect of the invention is the formation of raised source and drain structures within a space left by the spacers that define the width of the transistor body.

DETAILED DESCRIPTION

Figure 1A:
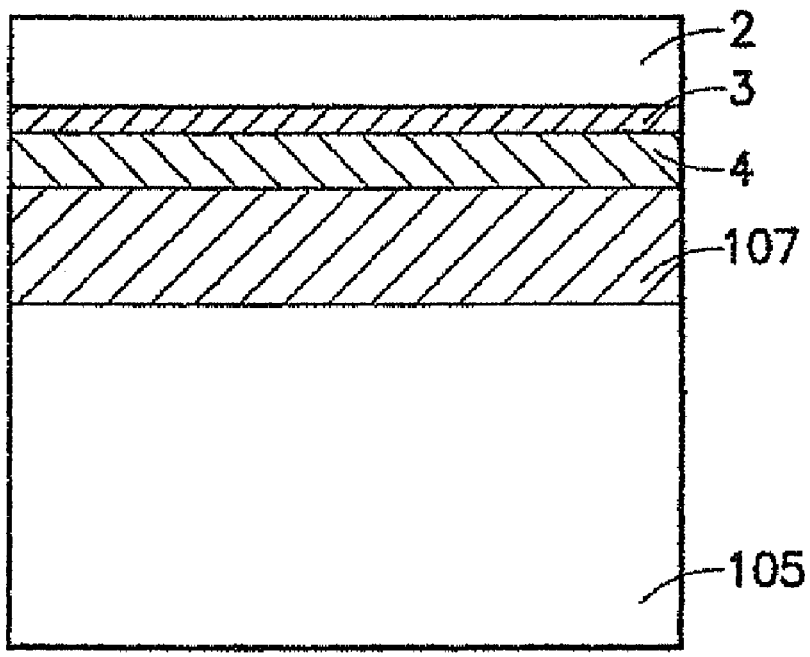
FIGS. 1A and 1B show steps in the formation of the original unpatterned structure.

FIG. 1A shows an initial SOI wafer having bulk substrate 105, with buried oxide (BOX) 107 separating the bulk substrate from the singe-crystal silicon SOI layer 4 that will become the transistor body. Layer 4 has a nominal thickness that may range from 2 nm to 50 nm.

A layer of thermal oxide 3 that will become the back gate dielectric is grown on silicon layer 4 to a thickness of 1 nm to 3 nm and a layer of polycrystalline silicon (poly) 2 is deposited by CVD in the range of 100 nm to 400 nm that will become the back gate electrode. Layer 3 may be composed of oxynitride or may be nitridized as a design choice, so long as it is suitable for a gate dielectric.

Figure 1B:
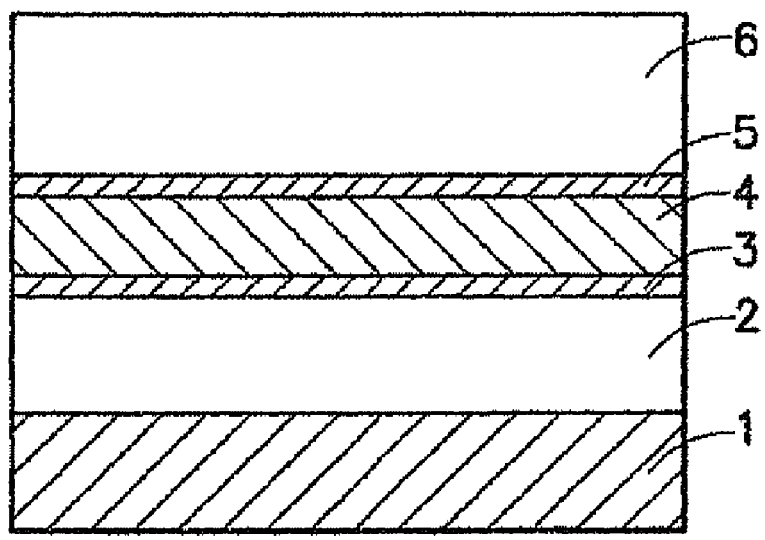

FIG. 1B shows the result of bonding a second, bulk wafer to the first one and removing substrate 105, e.g. by grinding and BOX layer 107, e.g. by etching in dilute hydrofluoric acid. The new substrate is denoted with the numeral 1 in FIG. 1B.

Layer 4 is oxidized again with a thermal oxide 5 that will become the front gate dielectric. Layer 5 may also be oxynitride or may be nitridized. It may also optionally be a high dielectric material such as $ZrO_2$, $HfO_2$, $AlO_2$ or other conventional high-k material. Another poly layer 6 is deposited by CVD, preferably in the range of 70 nm to 250 nm in thickness.

Figure 2:
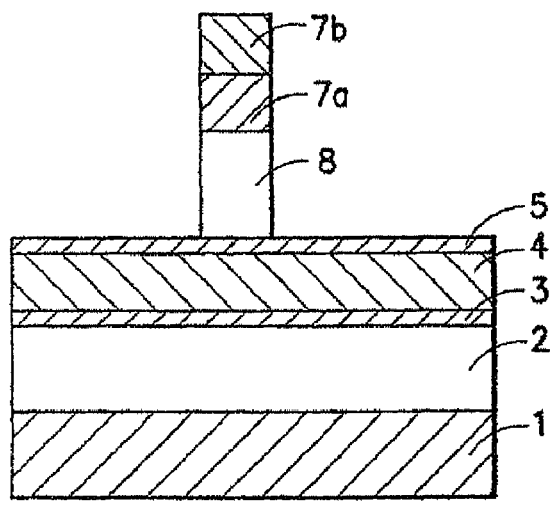
FIG. 2 shows a front gate electrode.

FIG. 2 shows the result of depositing on poly layer 6 a pair of first and second pattern transfer layers, illustratively layer 7a of 10 nm to 70 nm of oxide ($SiO_2$) and layer 7b of 10 nm to 70 nm of nitride ($Si_3N_4$). A layer of photoresist is deposited and patterned to define the front gate. The pattern transfer layers are etched to define a hardmask and the resist is stripped. Poly layer 6 is etched using the hardmask as a pattern to form first (front) gate 8.

Figure 3:
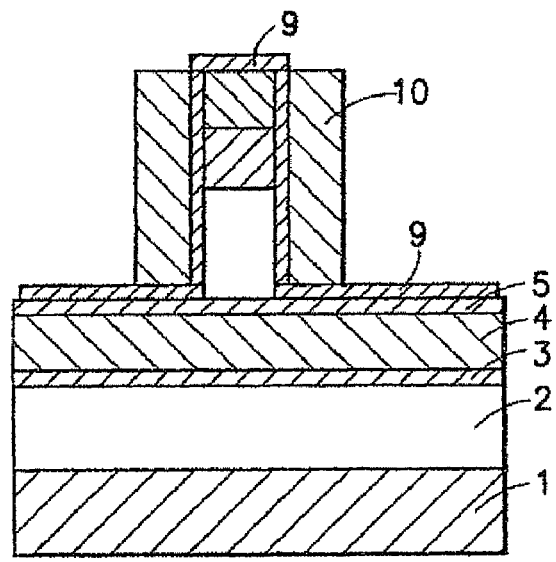
FIG. 3 shows the formation of a first pair of spacers defining the transistor body.

FIG. 3 shows the result of depositing and defining layers that will protect first gate 8 during the formation of the second or back gate. A conformal oxide layer 9 is deposited, illustratively of CVD TEOS 2 nm to 10 nm in thickness. Next, a CVD nitride film 10 nm to 100 nm thick is deposited. The nitride film is etched in a conventional directional etch to remove the film on horizontal surfaces to form nitride spacers 10, stopping the etch on oxide film 9.

Figure 4:
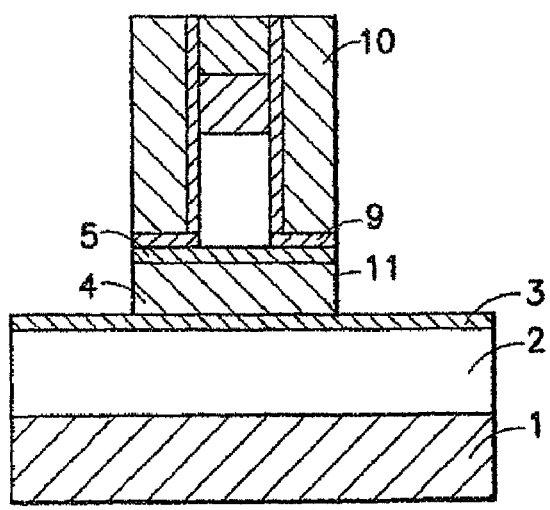
FIG. 4 shows the result of etching the SOI layer to define the transistor body.

FIG. 4 shows the result of performing another directional etch on layer 9 and gate layer 5, e.g. with HBr chemistry and a directional etch that removes silicon selectively to oxide (e.g. HBr chemistry) to etch through layer 4, stopping on layer 3. The preceding directional etches are conventional and generically described as reactive ion etches.

The result is that the transistor body has been defined to extend past the first gate electrode on both the left and right in the figure by the thickness of spacers 9 and 10. Spacers 9 and 10 will be referred to as being in proximity to the gate and to the vertical edge of the transistor body, meaning that they are close to the referenced structure but not necessarily directly in contact with it. Additional liners may be deposited as an etch stop or as an insulator to remain in the final structure. The vertical edge of the transistor body is denoted with numeral 11 in this figure and will be contacted by additional silicon added in a later stage. The thickness of the transistor body perpendicular to the plane of the paper will be set according to the designed current capacity of the transistor, as is conventional.

Optionally, an extra space may be allowed in front of or behind the plane of the paper to make contact with the lower gate electrode that will be formed from layer 2.

Figure 5:
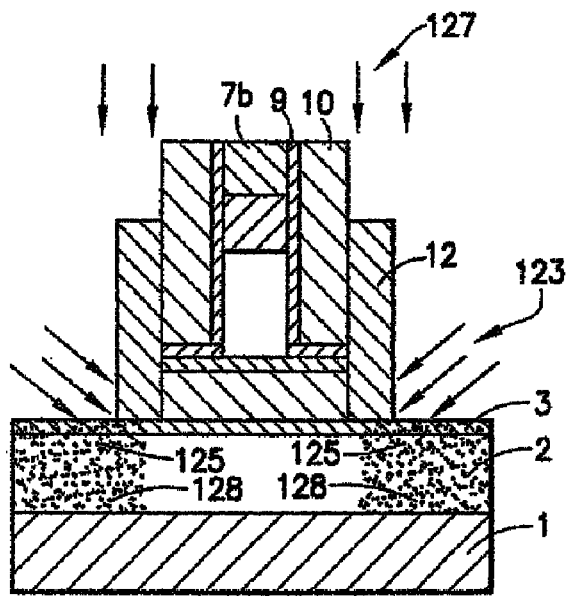
FIG. 5 shows the formation of a second pair of spacers that protect the transistor body during oxidation.

FIG. 5 shows the result of depositing a conformal layer of CVD nitride and etching it directionally to form spacers 12 that protect the vertical edge of the transistor body and also define the boundary of the area in layer 2 that will be oxidized in the following step.

Figure 6:
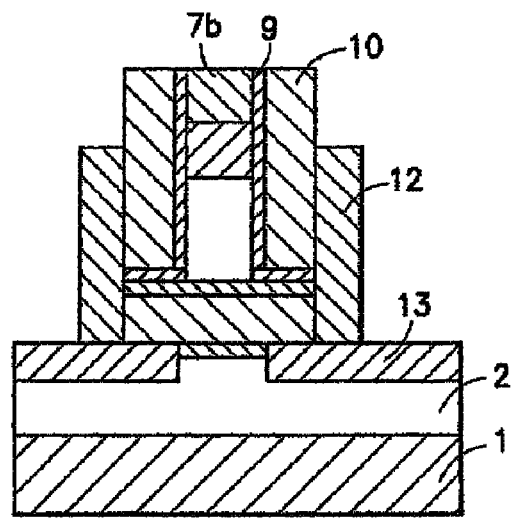
FIG. 6 shows the result of the oxidation that defines the width of the back gate electrode.

Illustratively, as shown in FIG. 6, the thickness of spacers 10 and 12 are set to facilitate the following oxidation step, in which layer 2 is oxidized through oxide layer 3, so that only the central unoxidized portion functions as the back gate electrode.

Those skilled in the art would not think to exploit the transverse growth of oxide to penetrate under the transistor body because the expansion in volume of the oxide compared with silicon would have been though to delaminate or to exert undesired stress on the transistor body.

Advantageously, it has been found that the transverse oxide growth is rapid enough in the poly layer 2 that the resulting stress is acceptable. In addition, it has been found that if the oxidation is performed at a temperature of about 1000C or greater for a time of about 20 min or greater, that the stress caused by the oxidation is relaxed since the SiO2 is more viscous under these conditions.

The parameters of the oxidation step are adjusted empirically to provide for the correct amount of sideways growth. Optionally, an angled ion implant of phosphorus or other oxide-promoting species, indicated schematically by arrows 123 in FIG. 5 and by shaded area 125, can be used prior to the oxidation to facilitate and control the lateral oxidation extent. The angle with respect to the wafer normal will depend on the height and spacing of nearby structures. The dose and voltage will be set empirically. Greater lateral penetration can be achieved by increasing the voltage.

Alternatively, or additionally, a nitrogen (or other oxide-retarding species) implant, indicated schematically by arrows 127 and shaded area 128 in FIG. 5, may be performed at a normal incidence angle. The back gate electrode with a sufficient amount of nitrogen incorporation will retard the oxidation in the vertical direction thereby enabling more control and flexibility over the vertical to lateral oxidation extent. The voltage can be set to leave a light dose near the top of layer 2 and a retarding dose in the lower portion.

The oxide 13 penetrates a nominal 30-70 nm sideways toward the central portion and a nominal 30-70 nm downward.

Figure 7:
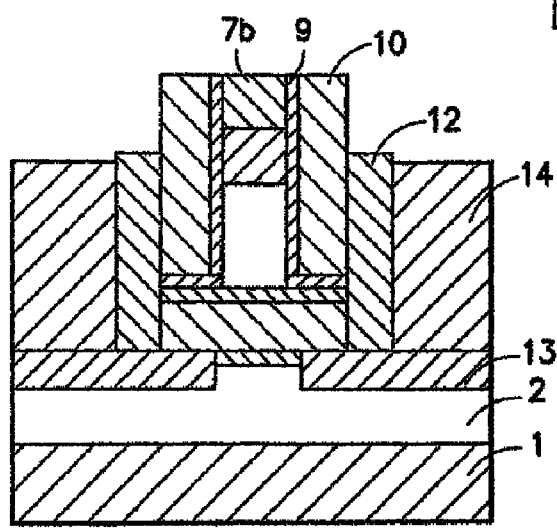
FIG. 7 shows the result of depositing dielectric enclosing the transistor structure.

FIG. 7 shows the result of depositing a CVD oxide film 14 to a thickness nominally greater than the height of the gate stack (plus layers 7a and 7b), that is then planarized, e.g. in a chemical-mechanical polishing (CMP) process.

After planarization, the oxide is recessed to a height less than the height of the gate stack (and greater than the height of gate 8).

Figure 8:
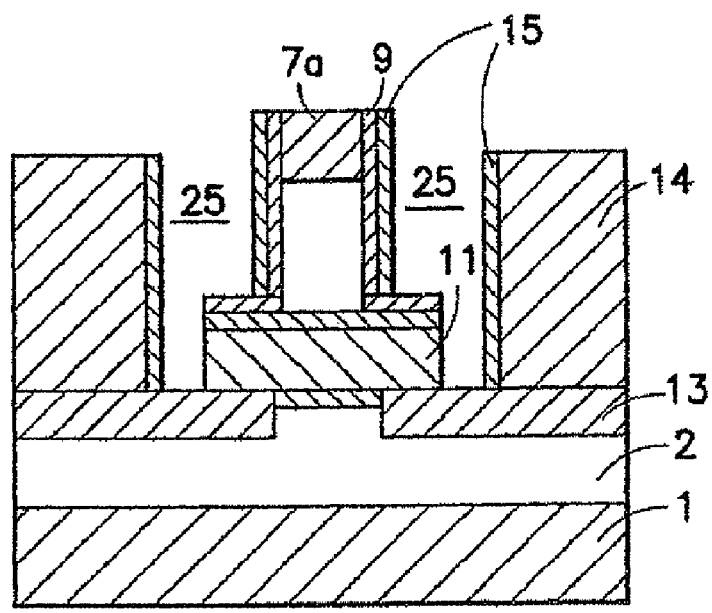
FIG. 8 shows the result of stripping the spacers to form an aperture holding the raised S/D structures.

FIG. 8 shows the result of stripping the spacers 10 and 12 and cap 7b, e.g. in hot phosphoric acid, to open an aperture 25 for the raised source-/drain structures. Another nitride spacer 15, having a nominal thickness of 10-70 nm, is formed on the vertical surfaces of the aperture to isolate the S/D contacts from the gate. An implant of conventional magnitude for the S/D may be performed in aperture 25 at this time. The completion of the S/D, whether at this time or after the raised S/D step shown in FIG. 9, completes the transistor.

A conventional cleaning step (preferably wet cleaning) removes any residue from vertical surfaces 11 of the transistor body to make a good contact between the body and the raised S/D structures.

Figure 9:
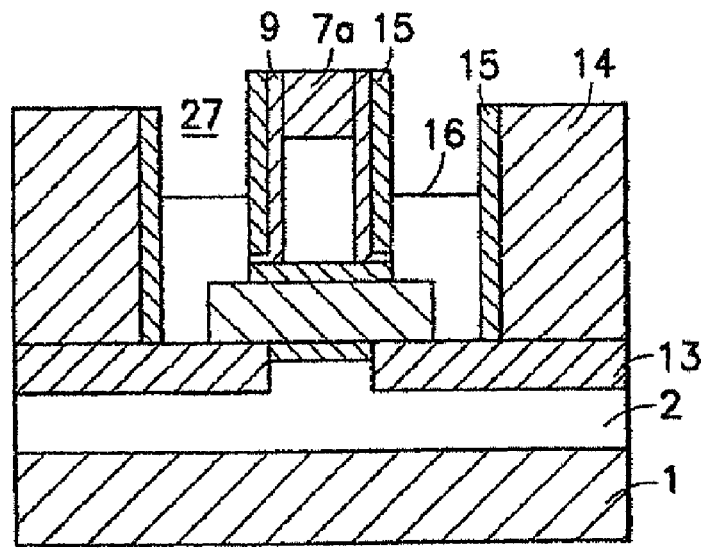
FIG. 9 shows the raised S/D contacts with isolating dielectric to insulate the S/D contacts.

FIG. 9 shows the result of filling aperture 25 with silicon 16—by selective epitaxy, or by deposition of amorphous silicon or poly (with or without a S/D implant). A planarization, e.g. CMP followed by a dry etch to recess the silicon results in the structure shown, in which apertures 27 are prepared for the deposition of a conventional interconnect to connect transistors to form the circuit.

Conventional middle of the line and back of the line steps are performed to complete the circuit, referred to for convenience as completing the circuit.

The layers that form gate electrodes 2 and 8 are put down with conventional dopant concentrations (or implanted later) sufficient to provide the proper conductivity for the gates. Similarly, the raised S/D structures have the proper amount of dopant added during deposition.

Layer 4 that forms the transistor body may have a conventional dopant concentration. Those skilled in the art are aware of the type and concentration of dopants to form NFETs and PFETs.

Process Flow
Initial Wafer Preparation
Start with SOI wafer with silicon SOI layer
Thermal oxide for back gate dielectric
Poly for back gate electrode
Bond Carrier Wafer
Remove initial substrate
Remove initial BOX
Front gate dielectric
Front gate electrode
Gate Patterning
Pattern transfer layer 1 (oxide)
Pattern transfer layer 2 (nitride)
Pattern front gate
First Spacer Formation
Deposit Etch stop layer
Deposit Spacer layer
Directional etch to form spacers
Channel Patterning
Etch pattern transfer layer 1

Etch channel, stopping on back oxide
Second Spacer Formation
Deposit spacer material
Define spacers
Define Self-Aligned Back Gate
Oxidize Back Gate Layer, extending oxidation horizontally to define self-aligned gate
Deposit Thick Dielectric, planarize
Remove First and Second Spacers
Gate Isolation Spacers
S/D Contact Deposition While the invention has been described in terms of a single preferred embodiment, those skilled in the art will recognize that the invention can be practiced in various versions within the spirit and scope of the following claims.

What is claimed is:

1. A double-gate transistor comprising:
a back gate electrode located above a substrate;
a back gate dielectric layer located above said back gate electrode;
a front gate dielectric layer located above said back gate dielectric layer;
a front gate electrode layer above said front gate dielectric layer and vertically aligned with said back gate electrode;
a transistor body disposed above said back gate dielectric layer, wherein said transistor body extends beyond sidewall edges of said front gate electrode layer, said back gate electrode having a layer of oxide formed below transistor body and on either side of a central mesa portion of said back gate electrode, said central mesa portion of said back gate electrode extends upward from a lower portion of the back gate electrode and has a length that is less than a length of said lower portion, and wherein said central mesa portion of said back gate electrode is vertically aligned to said front gate electrode layer; and
source and drain electrodes on opposite sides of said transistor body.

2. The transistor according to claim 1, in which conductive S/D contact members are disposed above said source and drain electrodes, extending above said front gate dielectric layer to a contact surface at a height less than said front gate electrode layer.

3. The transistor according to claim 1, wherein said transistor body comprises a single-crystal silicon SOI layer.

4. The transistor according to claim 1, wherein said transistor body has a thickness from about 2 to about 50 nm.

5. The transistor according to claim 1, wherein said back gate dielectric layer comprises a thermal oxide, an oxynitride, a nitridized oxide or combinations thereof.

6. The transistor according to claim 1, wherein said back gate dielectric layer is a thermal oxide.

7. The transistor according to claim 1, wherein said back gate dielectric layer has a thickness from about 1 to about 3 nm.

8. The transistor according to claim 1, wherein said back gate electrode comprises polysilicon.

9. The transistor according to claim 1, wherein said back gate electrode has a thickness from about 100 to about 400 nm.

10. The transistor according to claim 1, wherein said front gate dielectric layer comprises a thermal oxide, oxynitride, a nitridized oxide, a high-k gate dielectric or combinations thereof.

11. The transistor according to claim 1, wherein said front gate dielectric layer comprises a thermal oxide.

12. The transistor according to claim 1, wherein said back gate dielectric layer and said front gate dielectric layer are both composed of a thermal oxide.

13. The transistor according to claim 1, wherein said front gate electrode layer comprises polysilicon.

14. The transistor according to claim 1, wherein said front gate electrode layer has a thickness from about 40 to about 250 nm.

15. A double-gate transistor comprising:
a back gate electrode located over a substrate;
a back gate thermal oxide layer located above said back gate electrode;
a front gate thermal oxide layer located above said back gate thermal oxide layer;
a front gate electrode layer above said front gate thermal oxide layer and vertically aligned with said back gate electrode;
a transistor body disposed above said back gate thermal oxide layer, wherein said transistor body extends beyond sidewall edges of said front gate electrode layer, said back gate electrode having a layer of oxide formed below said transistor body and on either side of a central mesa portion of said back gate electrode, said central mesa portion of said back gate electrode extends upward from a lower portion of the back gate electrode and has a length that is less than a length of said lower portion, and wherein said central mesa portion of said back gate electrode is vertically aligned to said front gate electrode layer; and
source and drain electrodes on opposite sides of said transistor body.

16. The transistor according to claim 15, in which conductive S/D contact members are disposed above said source and drain electrodes, extending above said front gate thermal oxide layer to a contact surface at a height less than said front gate electrode layer.

17. The transistor according to claim 15, wherein said front gate electrode layer and said back gate electrode layer both comprise polysilicon.

18. A semiconductor structure comprising:
a substrate;
a back gate electrode located on an upper surface of said substrate, said back gate electrode having a lower portion and an upper central mesa portion extending from said lower portion, said upper central mesa portion having a length less than a length of the lower portion;
a back gate dielectric layer located only atop said upper central portion of said back gate electrode;
an oxide layer adjacent to said back gate dielectric layer and located on either side of said upper central mesa portion of said back gate electrode and on an upper surface of the lower portion of the back gate electrode;
a transistor body located above said back gate dielectric layer and portions of said oxide layer;
a front gate dielectric layer located on an upper surface of said transistor body, wherein outer edges of said front gate dielectric layer do not extend beyond outer edges of said transistor body;

a front gate electrode layer located atop said front gate dielectric layer, wherein said transistor body has vertical edges that extend beyond edges of the back gate dielectric layer and sidewall edges of said front gate electrode layer; and raised source/drain regions extending from an upper surface of said oxide layer and located on said sidewall edges of said transistor body, said source/drain regions have an upper surface that is lower than the upper surface of said front gate electrode layer.

* * * * *